United States Patent [19]

Maher et al.

[11] Patent Number: 4,545,024

[45] Date of Patent: Oct. 1, 1985

[54] HYBRID NATURAL RANDOM NUMBER GENERATOR

[75] Inventors: David P. Maher, Westboro; Robert J. Rance, Bradford, both of Mass.

[73] Assignee: AT&T Bell Laboratories, Murray Hill, N.J.

[21] Appl. No.: 489,265

[22] Filed: Apr. 27, 1983

[51] Int. Cl.⁴ .............................................. H03K 3/84
[52] U.S. Cl. ...................................... 364/717; 331/78
[58] Field of Search ........................... 364/717; 331/78

[56] References Cited

U.S. PATENT DOCUMENTS

| | | | |
|---|---|---|---|
| 3,649,915 | 3/1972 | Mildonian, Jr. | 375/17 |
| 3,706,941 | 12/1972 | Cohn | 331/78 |
| 3,790,768 | 2/1974 | Chevalier | 364/717 |
| 3,866,029 | 2/1975 | Chevalier | 364/717 |
| 4,176,399 | 11/1979 | Hoffmann et al. | 364/717 |
| 4,355,366 | 10/1982 | Porter | 364/717 |

Primary Examiner—David H. Malzahn
Attorney, Agent, or Firm—John Francis Moran; David R. Padnes

[57] ABSTRACT

A digital processor (16) is disclosed for improving the statistical characteristics of nondeterministic random-like binary sequence. The basic elements of the digital processor are a feedback loop comprising a delay (17) and a signal combiner (18) and a subsampler (19). Maximum performance of the digital processor is achieved when a relatively prime relationship exists between number of cells in the delay (17) and ratio of the original signaling rate to the output signaling rate of the subsampler (19). Mathematical analysis is presented for showing that the digital processor improves both the equidistribution of the binary variable and autocorrelation statistic of output signal over the nondeterministic random-like binary signal. A further improvement in statistical properties is obtained by using two digital processors (116 and 121) in serial fashion.

11 Claims, 2 Drawing Figures

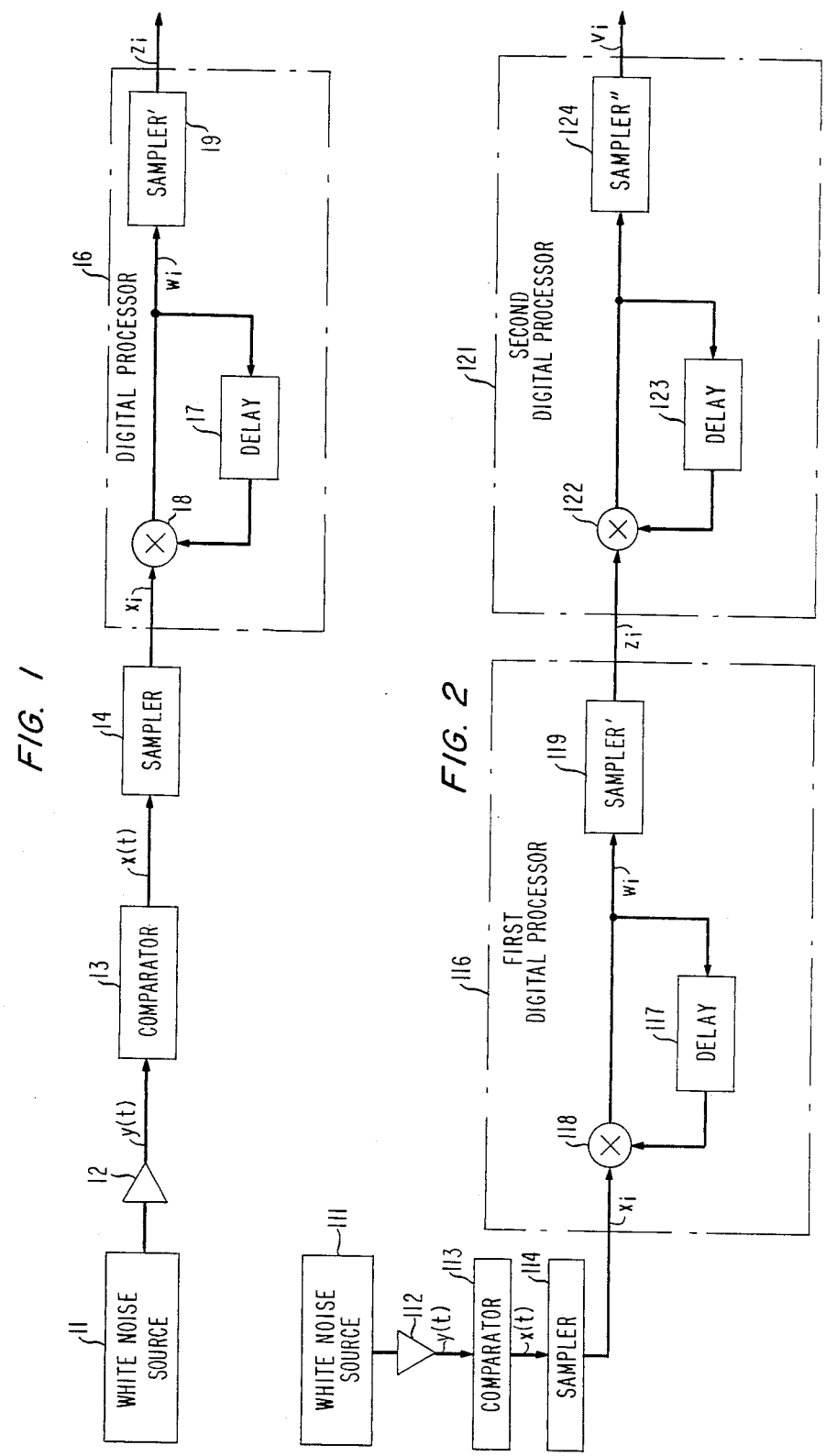

HYBRID NATURAL RANDOM NUMBER GENERATOR

BACKGROUND OF THE INVENTION

This invention relates to the generation of random signals and, more particularly, it relates to the generation of a binary random variable with improved statistical properties.

Random signal sources are widely recognized as providing numerous desirable functions in a variety of applications such as in the fields of communications and testing. One conventional generation technique is to use feedback shift registers to provide a pseudorandom number sequence typically in binary form. Although a pseudorandom sequence may be considered random for some purposes, it is actually not random but deterministic as evidenced by the prefix "pseudo". Other generation techniques utilize a random signal device such as a noise diode but, in the process of deriving a useful binary signal from it, the mathematical characteristics or statistical properties of the binary signal are undesirably modified or biased.

In conventional random signal sources, there are two important statistical measures. In order for the signal to be unbiased, the states of a binary random signal on a statistical average should have equiprobability of occurrence. If the two signal states, for example, are $+1$ and $-1$, the statistical mean of the signal should be zero. Also, the bit-to-bit covariance of the signal should be very small. In this way, the use of the history of past signal state sequences to predict the present signal state is made more difficult. Satisfying these two conditions concurrently with low cost circuitry of low complexity has not heretofore been attainable.

SUMMARY OF THE INVENTION

The invention takes the form of a digital processor which accepts a nondeterministic random-like binary signal sequence and provides an output random binary signal sequence which has equiprobability or equidistribution of the two signal states and virtually zero covariance between signal states at different points in the sequence.

A feature of the invention is a digital processor which improves in a nonreversible fashion both the equiprobability of signal states and the autocovariance statistic of a random-like signal sequence provided by using conventional signal generation techniques.

In some of the further aspects of the invention, the digital processor utilizes the combination of a feedback loop and sub-sampling to provide a binary output sequence with improved statistical properties. When the number of delay cells is large and a relatively prime relationship exists between the number of cells in the delay of the feedback loop and the ratio of the signaling rate of the original nondeterministic random-like binary sequence to the sub-sampling rate, optimum improvement in statistical properties is obtained. The two key characteristics being the equiprobability of occurrence of the two signal states and a virtually zero autocorrelation statistic. When only a small number of delay cells is used, a further improvement in these statistical properties may be provided by using two digital processors serially connected together.

DETAILED DESCRIPTION

FIG. 1 is an embodiment which employs the principles of the invention. The initial signal is produced by white noise source 11 which is operated on by the remaining components in FIG. 1 to provide the output signal to the right. Source 11 provides a bandlimited, stationary white Gaussian noise signal such as that which is available from a number of commercial noise diodes. One commercial source of suitable noise diodes is MDF Products Inc. of Danbury, Conn. The output of source 11 is applied to amplifier 12 for amplification at the input of comparator 13. The output of comparator 13 is a bilevel signal wherein the two levels are plus one and minus one although zero and one, or space and pulse, may be preferable in some cases. In the first case, the mean of the signal is zero for equiprobable signal states while it is 0.5 for the latter case. The bilevel signal from comparator 13 is sampled by sampler 14 at a rate $f_s$ to provide synchronized bit stream $x_i$ for digital circuits.

It should be noted that the statistical properties of the signal from source 11 are initially very good but the necessity of using amplifier 12 and comparator 13 to provide a useful output signal compromises the statistical properties. The band of amplifier 12 and comparator 13 is limited and comparator 13 has an offset which biases its output. The result is that the statistics from the useful signal are unavoidably degraded by the processes of amplification and comparing.

In order to appreciate the effect of signal modification some typical operating parameters for the circuit of FIG. 1 will now be presented. With the proper operating current and bias voltage, the expected output level from a typical noise diode is approximately 0.8 $\mu V/\sqrt{Hz}$ with a power spectral density that is flat within $\pm 2$ dB from 10 Hz to 500 kHz. A typical offset for comparator 13 is $\Delta = 10$ millivolts. Suppose the voltage gain is 100 for amplifier 12 with a substantially flat transfer function from 100 Hz to 10 kHz. The output noise will then have a standard deviation $\sigma$ of 80 millivolts. By mathematical analysis this will produce a sequence $x_i$ with a mean $\mu = 0.05$. If sampler 14 has a frequency $f_s = 10$ kHz, then, according to a 2-pole amplifier model the covariance between each value $x_i$ and any value $x_{1+j}$ for $1 \leq j < 50$ will be on the order of $10^{-2}$ to $10^{-3}$. Such statistical values are unacceptable for many applications.

In order to improve the statistical properties of the signal, digital processor 16 reduces these statistics to zero in a nonreversible fashion. Digital processor 16 comprises a feedback loop which includes delay 17 and signal combiner 18. Delay 17 has an interval of d delay units, or cells, where the typical value of d is in a range from one to a few hundred. The output of the feedback loop is applied to sampler 19 which samples the signal at a slower rate designated as $f_{s'}$. If $f_{s'}$ is at 30 kHz, then the bit-to-bit covariance of $x_i$ is 0.08. This covariance is reduced by the feedback loop with d cells in delay 17 to produce the sequence of $w_i$. This latter sequence is then sampled at a rate $f_{s'} = 10$ kHz to produce a sequence $z_i$ with highly improved statistical properties. The result is that, after a brief period, $\mu_z$ becomes zero, and all correlations $\rho_z(k)$ for a spacing of $k \neq 0$ become zero except for values of k divisible by d. In these exceptional cases, the correlations will be for d sufficiently large, $\mu_x^{3m}$ where $m = k/d$. Actually, any value of d will serve to improve the statistical properties of the output signal. If $d=256$, the worst correlation is $\rho_z(256) \approx 1.25 \times 10^{-4}$; all other correlations will be much smaller. If the rate of $f_s$, is reduced to 6 kHz, then the correlation $\rho_z(256)$ will be $\approx 3 \times 10^{-7}$.

This technique is very general and will, for an amplifier of bandwidth B, allow production of random bits at a rate B Hz or better with zero mean and zero correlation for almost all bit proximities. The requirement for achieving these statistical properties is that d and $r=f_s/f_{s'}$ be relatively prime.

Mathematical theory will now be presented to provide a basis for understanding the inventive principles. More fundamental material is presented in a later section under the heading "Appendix". From FIG. 1, it is apparent that $$w_i = x_i \cdot w_{i-d} \tag{1}$$

ignoring initializations. Thus, $$w_{di-j} = x_{di-j} x_{d(i-1)-j} \cdots x_{d(i-k)-j} \cdots \tag{2}$$

After a period of time, $\mu_w = E[w_i]$ is the mean of a product of thousands or millions of bits $x_i$ each spaced d apart. Thus, (See Appendix) $\mu_w = 0$ unless the autocorrelation function for $\{x_i\}$ is almost identically equal to 1. On the other hand, the delay feedback loop is reversible and there is no increase in randomness in the $w_i$, as the mean and correlations of the input $x_i$ are reflected in higher-order moments of the output $w_i$. For example:

$$E[x_i] = E[(x_i \cdot x_{i-d} \cdot x_{i-2d} \cdots)(x_{i-d} x_{i-2d} \cdot x_{i-3d} \cdots)]$$

$$= E[w_i \cdot w_{i-d}]$$

$$E[x_i \cdot x_{i-1}] = E[w_i w_{i-1} \cdot w_{i-d} \cdot w_{i-d-1}].$$

But with d large, correlations of bits $w_i$ spaced <d apart are very small.

Consider now the subsampled sequence $z_i$ where we let $r = f_s/f_{s'}$. If r and d are relatively prime, then $\rho_z(k) = 0$ for all k not divisible by d, for $$E[z_n \cdot z_{n-k}] = E[(x_{rn} \cdot x_{rn-d} \cdot x_{rn-2d} \cdots)(x_{r(n-k)} \cdot x_{r(n-k)-d} \cdots)] \tag{3}$$

If d does not divide k, and r and d are relatively prime, then there are no duplications in the subscripts of the x's appearing in equation (3). Thus, there are no cancellations of the $x_i$ (symbolically), and $\rho_z(k)$ is the expected value of the product of 2rn/d bits. For n large, this will be zero. Therefore, in using the device in FIG. 1, we wait until n is large before using the $\{z_n\}$.

As for the case where d divides k: if we set $m = k/d$, then $$E[z_n \cdot z_{n-k}] = E[w_{rn} \cdot w_{r(n-k)}] \tag{4}$$

$$= E[x_{rn} \cdot x_{rn-d} \cdots x_{rn-(rm-1)d}].$$

Therefore, this correlation is the expectation of a product of rm bits spaced d apart. This correlation will also be small as long as d and r are large enough. In fact, it can be shown (See Appendix) that in this case, $|\rho_z(k)|$ is bounded by a homogenous polynomial of degree rm/2 in $|\rho_x(d)|$ and $\mu_x^2$ if rm is even. A similar result holds if rm is odd. If d is large enough so that $|\rho_x(d)| << |\mu_x|$, then $|\rho_z(k)|$ is on the order of $\mu_x^{rm}$.

Returning to our example, using formulae for the mean and autocorrelation of a biased Gaussian process (see Appendix), then for $r=3$, $d=256$, we have $\rho_x(1) \approx 0.08$, $\rho_x(d) \approx -5 \times 10^{-5}$, and $\mu_x \approx 0.05$. By the above analysis, $\rho_{z3m}(k) = 0$ after 1 second if 256 divides k, and $\rho_z(k) = (0.05)^{3m}$ for $k = 256m$. Also, $\mu_z = 0$. We can decrease $\rho_z(256)$ significantly by using a sampling rate $f_{s'}$ of 6 kHz or by increasing $f_s$ to 50 kHz. In the latter case $\rho_x(256) \approx -2.5 \times 10^{-4}$; thus, the mean bias is still the most significant contributor to the worst-case correlation.

FIG. 2 illustrates the use of two serially connected processors to provide a further improvement in the statistical characteristics of the output signal particularly when it is desirable to use smaller delays. Reference numerals in FIG. 2 whose last two digits correspond to the reference numerals in FIG. 1 are used for common components in the two figures which are identical in structure and function. The remaining portion of FIG. 2 includes second digital processor 121 which comprises signal combiner 122, delay 123, and sampler 124. Sampler 124 subsamples at a fractional rate of that used by sampler 119. For example, if sampler 119 operates at one-half the rate of sampler 114, then sampler 124 operates at one-third the rate of sampler 119. This double loop arrangement is capable of providing an output signal with an adjacent signal state correlation arbitrarily close to zero even when the delay d is equal to one for both processors. This capability still exists when the output of sampler 114 exhibits very high autocorrelation and mean bias. Accordingly, the circuit arrangment of FIG. 2 relaxes the statistical requirements of the initial binary noise signal.

Appendix

Values for the mean and correlation of the output of the digital processor are expressed as expectations of the following form:

$$R_n = E[V_1 \cdot V_2 \cdots V_n] \tag{A1}$$

where the $v_i$ are input values $x_i$ to the processor of FIG. 1, but may not be consecutive.

Define the variables $q_{i,j}$, $i \neq j$; $i = 1, 2, \ldots, n$ by $$q_{i,j} = E[v_i \cdot v_j] \tag{A2}$$

Expand $R_n$ in a multidimensional Taylor series in these $n(n-1)/2$ variables. Using Price's theorem (See R. Price, "A useful theorem for non-linear devices having Gaussian inputs", IRE PGIT, Vol. IT-4, 1958), we can calculate the Taylor coefficients, and using only the most significant terms, we get:

$$R_n \approx \sum_{k=1}^{n/2} \mu_x^{n-k} \left(\frac{2}{\pi}\right)^k \frac{1}{k!} \Sigma \, q_{r1,s1} q_{r2,s2} \cdots q_{rk,sk} \tag{A3}$$

where the inner sum is taken over all partitions into pairs of all 2k subsets of the sets [1,2, ..., n].

Since the $q_{i,j}$ are <1, $\mu_x = E[x_i] < 1$ and $q_{i,j}$ is very small for $|i-j|$ large, we get that $R_n \to 0$ as $n \to \infty$. Further, for small n we may apply a crude bound:

$$R_n \leq K(\mu_x^2 + |\rho|)^{n/2} \tag{A4}$$

where $|\rho|$ is the largest $|q_{i,j}|$, and K is a constant depending on n.

Thus, we can get estimates of the worst case correlation of the output of the digital processor, using (A3)

and (A4). We see that since most correlations as well as the mean value of the output are given by $R_n$ for n very large, these values must be 0 for all practical purposes.

It is to be understood that although the initial signal source takes the form of a derived binary output from a noise diode, the digital processor disclosed herein may be used to advantage with other means of generating random signals. With regard to the digital processor itself, the relatively prime relationship between the number of delay cells and the ratio of sampling rates provides optimum performance of the processor. The performance advantages of the digital processor may still be adequately realized without maintaining the relatively prime relationship. Also it should be clear that by varying certain parameters, the net bit rate of the output signal can be increased substantially while maintaining a high level of performance. It should also be clear that shift registers of varying designs could be used in place of the delay register. Accordingly, these and varied other modifications may be made to the illustrative embodiments by those skilled in the art without departing from the invention.

What is claimed is:

1. A random signal source comprising
    signal generating means for producing a nondeterministic random-like sequence of signal states occurring at a first rate, and
    signal processing means, connected to receive the nondeterministic random-like sequence, for producing an output signal sequence having an even distribution of signal states and uncorrelated occurrences of signal states, said output sequence being produced at a second rate which is a fixed submultiple of said first rate.

2. A random signal source comprising
    signal generating means for producing a nondeterministic random-like binary sequence of signal states at a first rate, and
    first signal processing means, connected to receive the random-like binary sequence, for producing an output signal sequence having more even equiprobability of signal states than the nondeterministic random-like binary sequence and having its covariance reduced to essentially zero, said output sequence being produced at a second rate which is a fixed submultiple of said first rate.

3. A signal source according to claim 2 wherein the first signal processing means comprises
    means for combining each received signal state with associated priorly-received signal states,
    feedback means comprising delay for providing said priorly-received signal states from the combined signal states, and
    sampling means for sampling the combined signal states at a rate lower than the first rate so that only selected signal states form the output signal sequence.

4. A signal source according to claim 3 wherein the delay stores a number of signal states and said number and the numerical ratio of the first rate divided by the second rate are relatively prime with respect to one another.

5. A signal source according to claim 4 further comprising a second signal processing means, connected to receive the output signal sequence, for providing a second output signal sequence having further improved statistical random properties relative to said output signal sequence, said second signal processing means comprising
    second means for combining each signal state and associated priorly-received received signal states of said output sequence,
    second feedback means comprising second delay for providing said priorly-received signal states of said output sequence from the combined signal states formed by said second combining means, and
    second means for sampling said combined signal states at a third rate.

6. The signal source of claim 5 wherein said third rate is a selected fraction of said second rate.

7. A random signal generator comprising
    noise generating means for producing an analog noise signal,
    converting means for changing the analog noise signal into a nondeterministic random-like signal sequence having signal states occurring at a first rate, and
    processing means for producing another nondeterministic random sequence from the nondeterministic random-like signal sequence, the random sequence having a more uniform distribution of signal states and greater independence of signal state occurrence than the nondeterministic random-like signal sequence, said random sequence being produced at a second rate which is a fixed submultiple of said first rate.

8. The generator of claim 7 wherein said first and second rates are independent of said noise signal.

9. A random signal source comprising
    signal generating means for producing a nondeterministic random-like sequence of signal states occurring at a first rate, and
    signal processing means, connected to receive the nondeterministic random-like sequence, for solely producing an output signal sequence at a second rate, said output signal sequence having an even distribution of signal states and uncorrelated occurrences of signal states.

10. A random signal source comprising
    signal generating means for producing a nondeterministic random-like binary sequence of signal states occurring at a first rate, and
    first signal processing means, connected to receive the nondeterministic random-like binary sequence, for solely producing an output signal sequence at a second rate, said output signal sequence having more even equiprobability of states than the nondeterministic random-like binary sequence and having its covariance reduced to essentially zero.

11. A random signal generator comprising
    noise generating means for producing an analog noise signal,
    converting means for changing the analog noise signal into a nondeterministic random-like signal sequence having signal states occurring at a first rate, and
    processing means for solely producing at a second rate another nondeterministic random sequence from the nondeterministic random-like signal sequence, the random sequence having a more uniform distribution of signal states and greater independence of signal state occurrence than the nondeterministic random-like signal sequence.

* * * * *